United States Patent
Park et al.

(10) Patent No.: US 11,705,915 B2
(45) Date of Patent: Jul. 18, 2023

(54) METHOD OF OPERATING ANALOG-TO-DIGITAL CONVERTER AND ANALOG-TO-DIGITAL CONVERTER PERFORMING THE SAME

(71) Applicant: Samsung Electronics Co., Ltd., Suwon-si (KR)

(72) Inventors: Sangwook Park, Suwon-si (KR); Changkyoun Oh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/573,555

(22) Filed: Jan. 11, 2022

(65) Prior Publication Data

US 2022/0286139 A1 Sep. 8, 2022

(30) Foreign Application Priority Data

Mar. 2, 2021 (KR) .................. 10-2021-0027385

(51) Int. Cl.
*H03M 1/06* (2006.01)
*H03M 1/10* (2006.01)
*H04N 17/00* (2006.01)

(52) U.S. Cl.
CPC ........ *H03M 1/1028* (2013.01); *H04N 17/002* (2013.01)

(58) Field of Classification Search
CPC . H03M 1/1028; H04N 5/3651; H04N 17/002; H04N 5/351; H04N 5/3745
See application file for complete search history.

(56) References Cited

U.S. PATENT DOCUMENTS

| | | | |
|---|---|---|---|
| 6,445,317 B2 | 9/2002 | Lundin et al. | |
| 7,107,175 B2 | 9/2006 | Maloberti et al. | |
| 7,245,893 B1 | 7/2007 | Husted et al. | |
| 9,525,428 B2 | 12/2016 | Devarajan et al. | |
| 9,537,499 B2 | 1/2017 | Harpe | |
| 9,654,133 B2 | 5/2017 | Speir et al. | |
| 10,345,416 B2 | 7/2019 | Banhegyesi | |
| 2013/0293402 A1* | 11/2013 | Naudet | H03M 1/1071 341/120 |
| 2023/0007194 A1* | 1/2023 | Nagaki | H04N 17/002 |

* cited by examiner

*Primary Examiner* — Joseph J Lauture
(74) *Attorney, Agent, or Firm* — Muir Patent Law, PLLC

(57) ABSTRACT

In a method of operating an analog-to-digital converter, a gain error and an offset error that are associated with a digital code generated from the analog-to-digital converter are obtained by performing a first analog-to-digital conversion on a first input analog signal. The gain error and the offset error are stored. A calibration digital code is generated by performing a second analog-to-digital conversion on a second input analog signal based on the gain error and the offset error.

19 Claims, 12 Drawing Sheets

METHOD OF OPERATING ANALOG-TO-DIGITAL CONVERTER AND ANALOG-TO-DIGITAL CONVERTER PERFORMING THE SAME

CROSS-REFERENCE TO RELATED APPLICATION

This application claims priority under 35 USC § 119 to Korean Patent Application No. 10-2021-0027385 filed on Mar. 2, 2021 in the Korean Intellectual Property Office (KIPO), the disclosure of which is herein incorporated by reference in its entirety.

BACKGROUND

1. Technical Field

Example embodiments relate generally to semiconductor integrated circuits, and more particularly to methods of operating analog-to-digital converters, and analog-to-digital converters performing the methods.

2. Description of the Related Art

A system-on-chip (SOC) refers to a processing system that integrates various functional blocks (e.g., a central processing unit, a memory, an interface unit, a digital signal processing unit, an analog signal processing unit, etc.) into a single or a few semiconductor integrated circuits (ICs) to implement an electronic system, such as a computer system, using a limited number of ICs.

A system-on-chip may include an analog-to-digital converter (ADC) that converts an analog signal into a digital code or digital signal. The analog-to-digital converter samples the analog signal to convert the analog signal into the digital code or digital signal corresponding to a magnitude of the analog signal. An output (e.g., the digital code or digital signal) of the analog-to-digital converter may have some errors or tolerances due to the characteristics of the semiconductor manufacturing process. Thus, various methods for calibrating the errors or tolerances in the output of the analog-to-digital converter have been researched.

SUMMARY

At least one example embodiment of the present disclosure provides a method of operating an analog-to-digital converter capable of efficiently calibrating errors caused by a distribution of characteristics in a mass production.

At least one example embodiment of the present disclosure provides an analog-to-digital converter that performs the method of operating the analog-to-digital converter.

According to example embodiments, in a method of operating an analog-to-digital converter, a gain error and an offset error that are associated with a digital code generated from the analog-to-digital converter are obtained by performing a first analog-to-digital conversion on a first input analog signal. The gain error and the offset error are stored. A calibration digital code is generated by performing a second analog-to-digital conversion on a second input analog signal based on the gain error and the offset error.

According to example embodiments, an analog-to-digital converter includes a storage and an analog-to-digital converting circuit. The storage stores a gain error and an offset error that are associated with a digital code generated from the analog-to-digital converter. The gain error and the offset error are obtained by performing a first analog-to-digital conversion on a first input analog signal. The analog-to-digital converting circuit generates a calibration digital code by performing a second analog-to-digital conversion on a second input analog signal based on the gain error and the offset error.

According to example embodiments, in a method of operating an analog-to-digital converter, a first test digital code is generated by the analog-to-digital converter by performing a first analog-to-digital conversion on a first test analog signal, a second test digital code is generated by the analog-to-digital converter by performing the first analog-to-digital conversion on a second test analog signal different from the first test analog signal, a gain error associated with a digital code generated from the analog-to-digital converter is calculated by a test equipment based on the first test digital code and the second test digital code, and an offset error associated with the digital code generated from the analog-to-digital converter is calculated by the test equipment based on the gain error and one of the first test digital code and the second test digital code. The gain error and the offset error are stored into a storage disposed inside or outside the analog-to-digital converter, and the gain error and the offset error are loaded by the analog-to-digital converter from the storage. A first digital code is generated by the analog-to-digital converter by performing a second analog-to-digital conversion on a first input analog signal, and a first calibration digital code is generated by the analog-to-digital converter by calibrating the first digital code based on the gain error and the offset error. The gain error is calculated by obtaining a first difference digital code by subtracting the second test digital code from the first test digital code, by obtaining a second difference digital code by subtracting a second ideal digital code corresponding to the second test analog signal from a first ideal digital code corresponding to the first test analog signal, and by dividing the first difference digital code by the second difference digital code. The offset error is calculated by obtaining a second digital code by multiplying the gain error by the first ideal digital code, and by subtracting the second digital code from the first test digital code.

In the method of operating the analog-to-digital converter and the analog-to-digital converter according to example embodiments, the errors (e.g., the gain error and the offset error) caused by the distribution of the characteristics in the mass production may be measured, obtained and stored in advance by performing a test operation on the analog-to-digital converter during the manufacturing process of the analog-to-digital converter. In addition, the calibration digital code may be generated and output by performing the calibration operation for the analog-to-digital conversion based on the gain error and the offset error that are stored in advance. Further, an additional circuit (or hardware) and/or design change for performing the above-described calibration operation may not be required, and the calibration operation may be performed using an existing hardware configuration as it is. Accordingly, the analog-to-digital converter having higher accuracy may be implemented without an additional design overhead and additional design cost.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
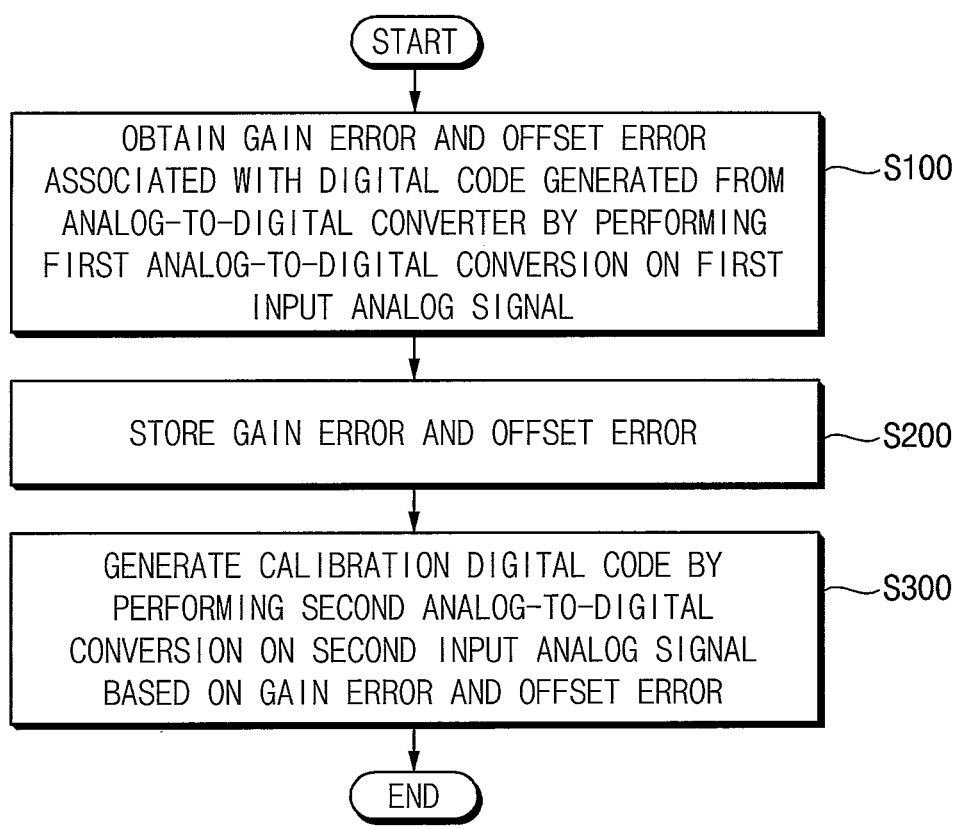
FIG. 1 is a flowchart illustrating a method of operating an analog-to-digital converter according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of operating an analog-to-digital converter according to example embodiments.

Referring to FIG. 1, in a method of operating an analog-to-digital converter (ADC) according to example embodiments, a gain error and an offset error that are associated with (or related to or with respect to) a digital code generated by performing a first analog-to-digital conversion on a first input analog signal are obtained (step S100). For example, the first analog-to-digital conversion may be performed in a test operation during a manufacturing process of the analog-to-digital converter. Step S100 will be described in detail with reference to FIG. 3.

In some example embodiments, the test operation may be a mass production test performed during a process of manufacturing the analog-to-digital converter in a mass production, and step S100 may be performed by a test equipment (or test system). For example, the test operation may include an operation of checking the electrical characteristic of the analog-to-digital converter itself. Typically, when the manufacturing of the analog-to-digital converter included in a semiconductor wafer and/or a semiconductor chip is completed through the semiconductor manufacturing process, it may be tested using the test equipment whether the analog-to-digital converter normally operates. While the analog-to-digital converter is tested, step S100 according to example embodiments may be performed to obtain the gain error and the offset error.

The gain error and the offset error that are obtained by step S100 are stored (step S200). For example, after the test operation is performed (e.g., after the test operation is completed), the gain error and the offset error may be stored in a storage.

In some example embodiments, as will be described with reference to FIG. 7, the storage may be disposed inside the analog-to-digital converter. In other example embodiments, as will be described with reference to FIG. 9, the storage may be disposed outside the analog-to-digital converter.

The analog-to-digital converter generates and outputs a calibration digital code by performing a second analog-to-digital conversion on a second input analog signal based on the gain error and the offset error (step S300). In some example embodiments, the second analog-to-digital conversion may be performed while the analog-to-digital converter is driving after the manufacturing process of the analog-to-digital converter. Step S300 will be described in detail with reference to FIG. 6. In some example embodiments, the second analog-to-digital conversion may be performed in the test operation during the manufacturing process of the analog-to-digital converter.

In some example embodiments, the driving process (e.g., step S300) of the analog-to-digital converter may be performed in an actual operating environment of a semiconductor device including the analog-to-digital converter. As used herein, the semiconductor device may refer, for example, to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices. Semiconductor packages may include a package substrate, one or more semiconductor chips, and an encapsulant formed on the package substrate and covering the semiconductor chips. The semiconductor chip may include the analog-to-digital converter for various purposes and/or functions, and may convert an analog input into a digital output using the analog-to-digital converter in the actual operating environment. While the semiconductor chip and the analog-to-digital converter are driving in the actual operating environment, step S300 according to example embodiments may be performed using the gain error and the offset error to improve or increase the accuracy of the digital output.

Due to the characteristics of the semiconductor manufacturing process, offset, linearity, etc. may vary for each semiconductor chip and/or semiconductor device. Thus, even when the same analog signal is input to a plurality of analog-to-digital converters that are manufactured through the same semiconductor manufacturing process, a plurality of digital codes output from the plurality of analog-to-digital converters may have some errors or tolerances due to the characteristics of the semiconductor manufacturing process.

Conventionally, an analog-to-digital converter was used in consideration of errors caused by a distribution of the characteristics (e.g., the characteristic differences) in a mass production. For example, when a 12-bit analog-to-digital converter is included in a system-on-chip that operates based on an analog voltage of about 0V to about 1.8V, the analog-to-digital converter was used in consideration of an error of about 10 mV depending on the above-described distribution of the characteristics although the analog-to-digital converter can theoretically distinguish a difference of about 0.44 mV. Terms such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0% to 5% deviation around 0.1 and a 0% to 5% deviation around 1, especially if such deviation maintains the same effect as the listed range. Conventionally, when an analog-to-digital converter having a relatively high accuracy is required, a resolution of the analog-to-digital converter was increased, or a known reference signal was received as a separate input and an output was calibrated using the reference signal. However, for the above-described conventional methods, an additional circuit and/or design change were required, and thus there was a problem in that a design overhead was increased.

In the method of operating the analog-to-digital converter according to example embodiments, the errors (e.g., the gain error and the offset error) caused by the distribution of the characteristics in the mass production may be measured, obtained and stored in advance by performing the test operation on the analog-to-digital converter during the manufacturing process of the analog-to-digital converter. In addition, while the analog-to-digital converter is driving in the actual operating environment after the manufacturing process, the calibration digital code may be generated and output by performing the calibration operation for the analog-to-digital conversion based on the gain error and the offset error that are stored in advance. Further, an additional circuit (or hardware) and/or design change for performing the above-described calibration operation may not be required, and the calibration operation may be performed using an existing hardware configuration as it is. Accordingly, the analog-to-digital converter having higher accuracy may be implemented without an additional design overhead and additional design cost.

Figure 2:
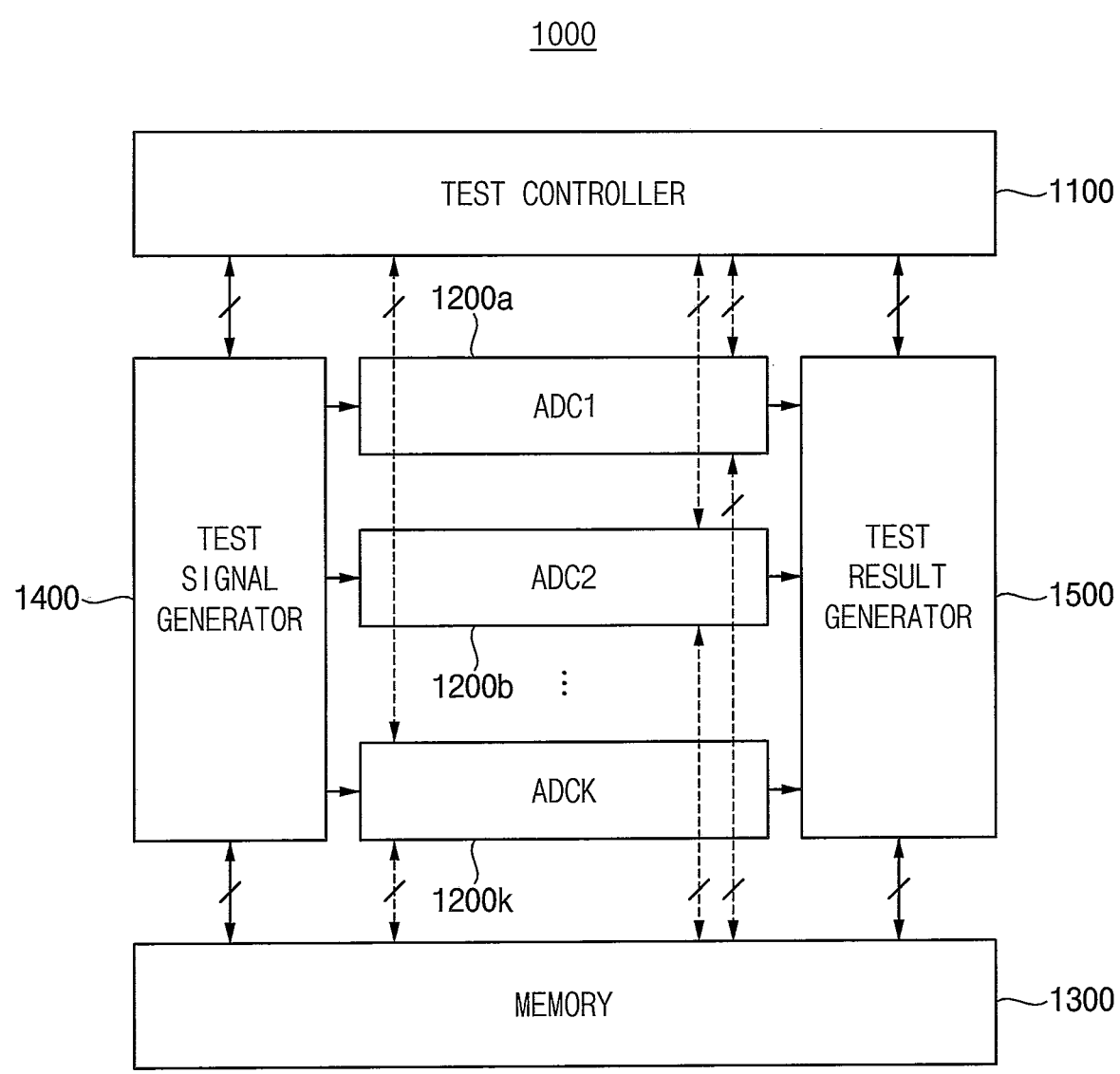
FIG. 2 is a block diagram illustrating a test equipment that performs a method of operating an analog-to-digital converter according to example embodiments.

FIG. 2 is a block diagram illustrating a test equipment that performs a method of operating an analog-to-digital converter according to example embodiments.

Referring to FIG. 2, a test equipment (or test system) 1000 includes a plurality of analog-to-digital converters (ADC1, ADC2, ..., and ADCK) 1200a, 1200b, ..., and 1200k, a test signal generator 1400 and a test result generator 1500, where each of K and k is a natural number greater than or equal to two. The test equipment 1000 may further include a test controller 1100 and a memory 1300.

The test equipment 1000 may test or check electrical characteristics of the plurality of analog-to-digital converters 1200a, 1200b, ..., and 1200k. For example, the test equipment 1000 may perform a direct current (DC) test for testing whether DC parameters are suitable or appropriate for a digital operation of a circuit, and an alternating current (AC) margin test associated with a transmission delay time, a set-up time and/or a hold time of signals. In addition, the test equipment 1000 may perform the operation of obtaining the gain error and the offset error for each of the plurality of analog-to-digital converters 1200a, 1200b, ..., and 1200k according to example embodiments. The test equipment 1000 may be referred to as an automatic test equipment (ATE).

Each of the plurality of analog-to-digital converters 1200a, 1200b, ..., and 1200k may be a target of the test operation performed by the test equipment 1000, and may be the analog-to-digital converter according to example embodiments. Each of the plurality of analog-to-digital converters 1200a, 1200b, ..., and 1200k may be referred to as a device under test (DUT).

In some example embodiments, the test operation may be directly performed on the plurality of analog-to-digital converters 1200a, 1200b, ..., and 1200k. In other example embodiments, the test operation may be performed on semiconductor chips (or semiconductor devices) and/or integrated circuits (ICs) that include the plurality of analog-to-digital converters 1200a, 1200b, ..., and 1200k. For example, as will be described with reference to FIG. 14, the semiconductor chip may include a system-on-chip (SOC) or an application processor (AP).

The test signal generator 1400 may generate a plurality of test signals that are provided to the plurality of analog-to-digital converters 1200a, 1200b, ..., and 1200k. For example, the test signal generator 1400 may generate test analog signals used to generate the gain error and the offset error.

The test result generator 1500 may generate a plurality of test result signals based on a plurality of output values that are generated by the plurality of analog-to-digital converters 1200a, 1200b, ..., and 1200k based on the plurality of test signals. For example, the test result generator 1500 may generate each of the plurality of test result signals by comparing a respective one of the plurality of output values with a reference value. In some examples, the test result generator 1500 may generate the gain error and the offset error based on test digital codes that are generated by the plurality of analog-to-digital converters 1200a, 1200b, ..., and 1200k based on the test analog signals. In some other examples, the test result generator 1500 may generate an optimum calibration digital code by receiving calibration digital codes that are generated by the plurality of analog-to-digital converters 1200a, 1200b, ..., and 1200k based on the test analog signals, the gain error and the offset error.

The test controller 1100 may control operations of the test signal generator 1400 and the test result generator 1500, may control other components in the test equipment 1000, and may control the test operation on each of the plurality of analog-to-digital converters 1200a, 1200b, ..., and 1200k.

In some example embodiments, each of the test controller 1100 and the test result generator 1500 may include at least one processor for various computations, calculations and/or data processing's. For example, the processor may include a field programmable gate array (FPGA) for parallel processing and/or a central processing unit (CPU) for serial processing. However, example embodiments are not limited thereto, and the processor may include any processor and/or controller for parallel processing and/or serial processing.

The memory 1300 may store data used to perform the test operation on each of the plurality of analog-to-digital converters 1200a, 1200b, ..., and 1200k.

In some example embodiments, the memory 1300 may include a volatile memory such as a dynamic random access memory (DRAM), a static random access memory (SRAM), or the like, and/or a nonvolatile memory such as a flash memory, a phase change random access memory (PRAM), a resistive random access memory (RRAM), a magnetic random access memory (MRAM), a ferroelectric random access memory (FRAM), a nano floating gate memory (NFGM), a polymer random access memory (PoRAM), or the like. However, example embodiments are not limited thereto, and the memory 1300 may include a solid state drive (SSD), a universal flash storage (UFS), a multimedia card (MMC), an embedded multimedia card (eMMC), a secure digital (SD) card, a micro SD card, a memory stick, a chip card, a universal serial bus (USB) card, a smart card, a compact flash (CF) card, or the like.

In some example embodiments, an interface between the components in the test equipment 1000 may be implemented with at least one of various bus formats such as a small computer system interface (SCSI), a serial attached SCSI (SAS), a USB, a peripheral component interconnect express (PCIe), an advanced technology attachment (ATA), a parallel ATA (PATA), a serial ATA (SATA), a nonvolatile memory express (NVMe), a UFS, an eMMC, etc.

Although not illustrated in detail, the test equipment 1000 may further include a board and/or a socket on which the plurality of analog-to-digital converters 1200a, 1200b, . . . , and 1200k are mounted, a handler that transfers the plurality of analog-digital converters 1200a, 1200b, . . . , and 1200k to the test equipment 1000, etc.

Figure 3:
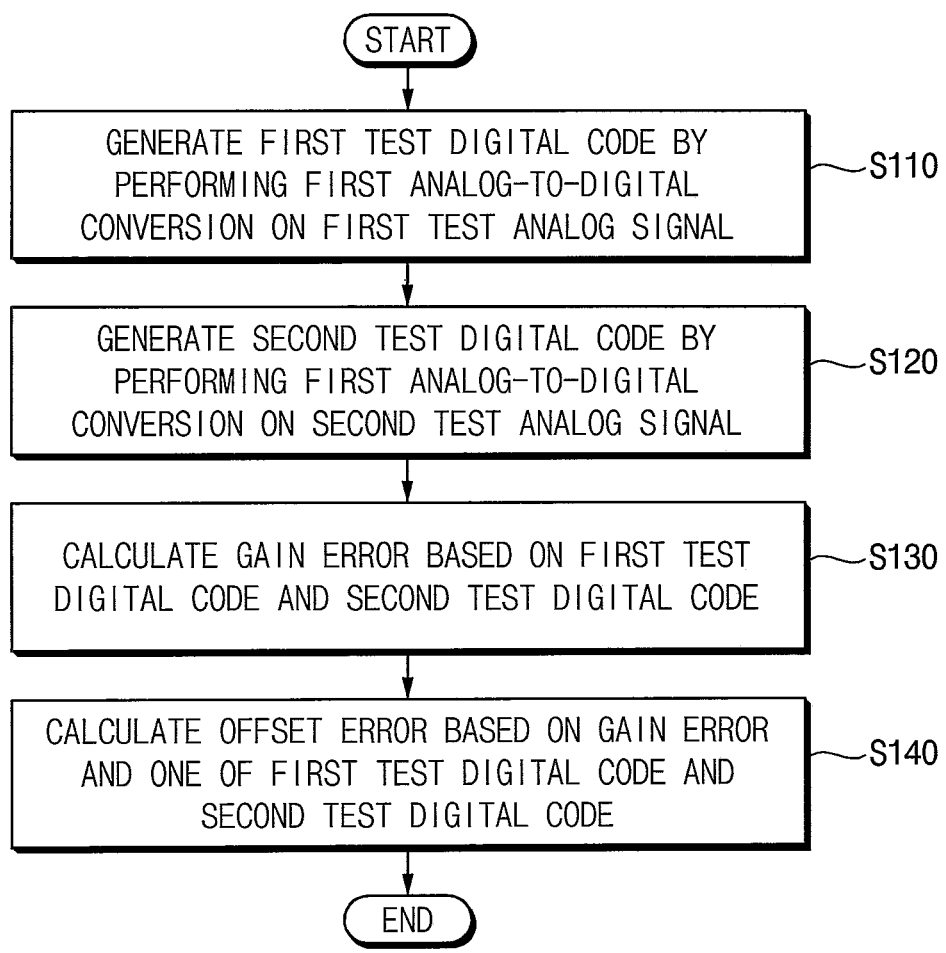
FIG. 3 is a flowchart illustrating an example of obtaining a gain error and an offset error in FIG. 1 according to example embodiments.

FIG. 3 is a flowchart illustrating an example of obtaining a gain error and an offset error in FIG. 1 according to example embodiments.

Referring to FIGS. 1 and 3, when obtaining the gain error and the offset error (step S100), the gain error and the offset error may be calculated based on a two-point calibration scheme. Herein, for convenience of description, the terms of "calculate," "generate," and "obtain" may be used interchangeably.

For example, the analog-to-digital converter may generate a first test digital code by performing the first analog-to-digital conversion on a first test analog signal (step S110), and the analog-to-digital converter may generate a second test digital code by performing the first analog-to-digital conversion on a second test analog signal different from the first test analog signal (step S120). For example, the first test analog signal and the second test analog signal may have different voltage levels.

The gain error may be calculated based on the first test digital code and the second test digital code (step S130), and the offset error may be calculated based on the gain error and one of the first test digital code and the second test digital code (step S140). A detailed process of calculating the gain error and the offset error will be described with reference to FIG. 5.

As described above, steps S110, S120, S130 and S140 may be performed in the test operation performed during the manufacturing process of the analog-to-digital converter, and may be performed, for example, by the test equipment 1000 of FIG. 2.

Figure 4A:
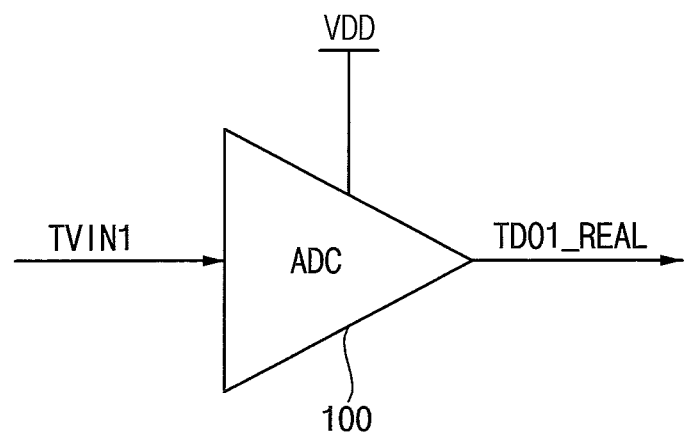
FIGS. 4A, 4B and 5 are diagrams for describing an operation of obtaining a gain error and an offset error of FIG. 3 according to example embodiments.
Figure 4B:
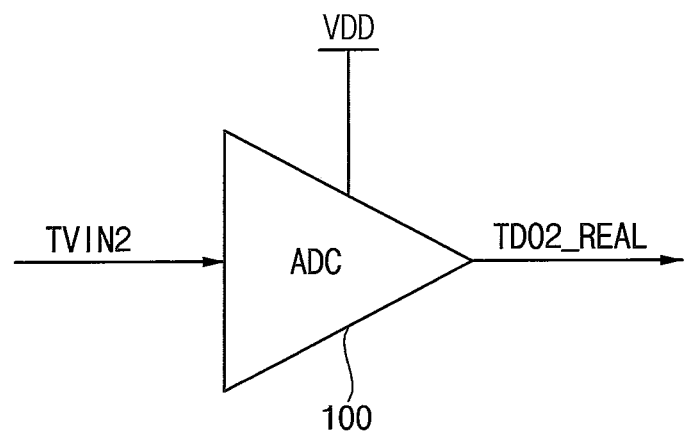
Figure 5:
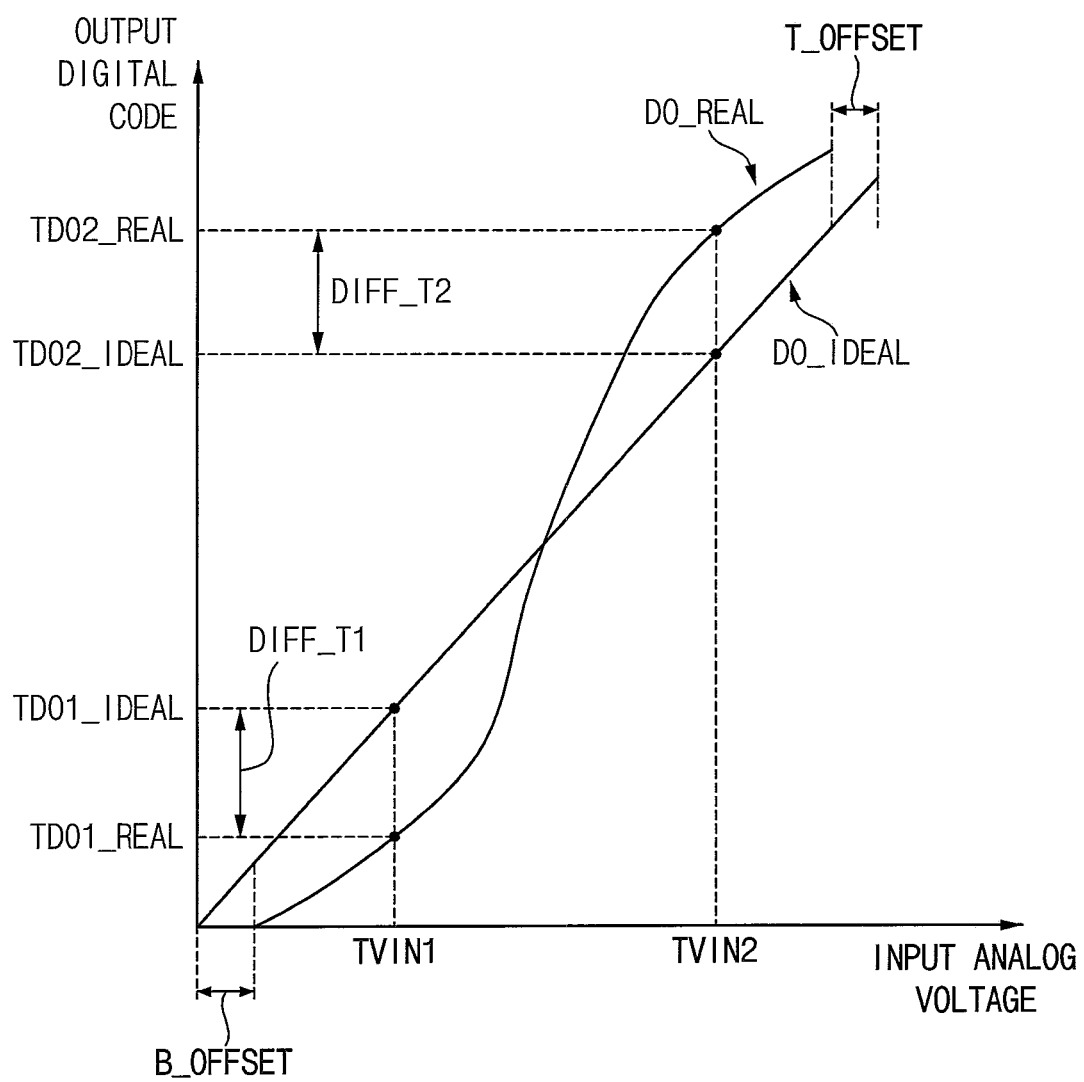

FIGS. 4A, 4B and 5 are diagrams for describing an operation of obtaining a gain error and an offset error of FIG. 3 according to example embodiments.

Referring to FIGS. 4A and 4B, an operation of generating the test digital codes by an analog-to-digital converter 100 based on the test analog signals is illustrated. The analog-to-digital converter 100 may operate based on a power supply voltage VDD, and may be one of the plurality of analog-to-digital converters 1200a, 1200b, . . . , and 1200k in FIG. 2.

As illustrated in FIG. 4A, the analog-to-digital converter 100 may generate a first test digital code TDO1_REAL by performing an analog-to-digital conversion on a first test analog signal TVIN1. For example, FIG. 4A may correspond to step S110 in FIG. 3. The test signal generator 1400 in FIG. 2 may generate the first test analog signal TVIN1 and may provide the first test analog signal TVIN1 to the analog-to-digital converter 100, and the first test digital code TDO1_REAL output from the analog-to-digital converter 100 may be provided to the test result generator 1500 in FIG. 2.

In addition, as illustrated in FIG. 4B, the analog-to-digital converter 100 may generate a second test digital code TDO2_REAL by performing an analog-to-digital conversion on a second test analog signal TVIN2. For example, FIG. 4B may correspond to step S120 in FIG. 3. The test signal generator 1400 in FIG. 2 may generate the second test analog signal TVIN2 and may provide the second test analog signal TVIN2 to the analog-to-digital converter 100, and the second test digital code TDO2_REAL output from the analog-to-digital converter 100 may be provided to the test result generator 1500 in FIG. 2.

In some example embodiments, the first test analog signal TVIN1 may have a first voltage level, and the second test analog signal TVIN2 may have a second voltage level higher than the first voltage level. For example, the first voltage level may correspond to a value that is obtained by multiplying a voltage level of the power supply voltage VDD by X, where X is a real number greater than zero and less than one. The second voltage level may correspond to a value that is obtained by multiplying the voltage level of the power supply voltage VDD by Y, where Y is a real number greater than X and less than one. For example, X may be about ⅛ and Y may be about ⅞. However, example embodiments are not limited thereto, and X and Y may be changed according to example embodiments.

Referring to FIG. 5, a relationship between an input analog voltage input to the analog-to-digital converter 100 and a digital code generated from the analog-to-digital converter 100 based on the input analog voltage is illustrated. In FIG. 5, "DO_IDEAL" represents a first relationship, which is an ideal relationship, between the input analog voltage and the digital code, and "DO_REAL" represents a second relationship, which is a real (or actual) relationship, between the input analog voltage and the digital code due to an error existing in the analog-to-digital converter 100.

When the first test analog signal TVIN1 is input to the analog-to-digital converter 100, a first ideal digital code TDO1_IDEAL should be generated and output depending on the first relationship DO_IDEAL theoretically, however, the first test digital code TDO1_REAL may be generated and output depending on the second relationship DO_REAL actually, due to the error existing in the analog-to-digital converter 100 if the calibration operation is not performed. Similarly, when the second test analog signal TVIN2 is input to the analog-to-digital converter 100, a second ideal digital code TDO2_IDEAL should be generated and output depending on the first relationship DO_IDEAL theoretically, however, the second test digital code TDO2_REAL may be generated and output depending on the second relationship DO_REAL actually, due to the error existing in the analog-to-digital converter 100.

As described above, due to the error existing in the analog-to-digital converter 100, a difference DIFF_T1 between the first ideal digital code TDO1_IDEAL and the first test digital code TDO1_REAL and a difference DIFF_T2 between the second ideal digital code TDO2_IDEAL and the second test digital code TDO2_REAL may occur. The causes of the differences DIFF_T1 and DIFF_T2 may include an offset error, a differential nonlinearity (DNL) (or differential nonlinearity error (DNE)), an integral nonlinearity (INL) (or integral nonlinearity error (INE)), etc.

The offset error may represent that the smallest output code is not generated when the lowest input voltage is provided and the largest output code is not generated when the highest input voltage is provided. For example, when a range of the input voltage is about 0V to about 1.8V and the output code is a 12-bit code, the output code having a value of "0" should be generated based on the input voltage having a voltage level of about 0V and the output code having a value of "4095" should be generated based on the input voltage having a voltage level of about 1.8V theoretically, however, an actual output code may be different from that described above due to the offset error. For example, the offset error may include a bottom offset error B_OFFSET and a top offset error T_OFFSET. In this case, the offset error may represent as a difference between two input voltages corresponding to the first relationship DO_IDEAL and the second relationship DO_REAL at the output code having a value of "0".

Although not shown in FIG. 5, the offset error may also represent that the output code having a value of "0" is generated until the input voltage increases to a certain voltage level. For example, the output code having a value of "0" may be generated based on the input voltage having a voltage greater than 0V due to the offset error. In this case, the offset error may represent as a difference between two output codes corresponding to the second relationship DO_REAL and a slope obtained from the second relationship DO_REAL at the input voltage having 0V.

Each of the differential nonlinearity and the integral nonlinearity is a commonly used measure of performance in the analog-to-digital converter. The differential nonlinearity is a term describing the deviation between two analog values corresponding to adjacent digital values. In the analog-to-digital converter, the integral nonlinearity is a term describing the deviation between the ideal input threshold value and the measured threshold level of a certain output code. For example, the differential nonlinearity error may represent an error caused by the difference of the input voltage with respect to the output code increasing by one code, and the integral nonlinearity error may represent an error between the ideal code and the actual code for the input voltage.

In the method of operating the analog-to-digital converter according to example embodiments, the gain error and the offset error may be calculated based on the first test digital code TDO1_REAL and the second test digital code TDO2_REAL, and the calibration operation may be performed based on the gain error and the offset error. Thus, the difference DIFF_T1 between the first ideal digital code TDO1_IDEAL and the first test digital code TDO1_REAL and the difference DIFF_T2 between the second ideal digital code TDO2_IDEAL and the second test digital code TDO2_REAL may be reduced.

In some example embodiments, the first test digital code TDO1_REAL may correspond to a value obtained based on Equation 1.

$$TDO1\_REAL = TVIN1 \times Gr + \text{offset error} \quad \text{[Equation 1]}$$

In some example embodiments, a real gain Gr may correspond to a value obtained based on Equation 2.

$$Gr = (TDO1\_REAL - TDO2\_REAL)/(TVIN1 - TVIN2) \quad \text{[Equation 2]}$$

In some example embodiments, the first ideal digital code TDO1_IDEAL may correspond to a value obtained based on Equation 3.

$$TDO1\_IDEAL = TVIN1 \times Gi \quad \text{[Equation 3]}$$

In some example embodiments, an ideal gain Gi may correspond to a value obtained based on Equation 4.

$$Gi = (TDO1\_IDEAL - TDO2\_IDEAL)/(TVIN1 - TVIN2) \quad \text{[Equation 4]}$$

In some example embodiments, the first test digital code TDO1_REAL may correspond to a value obtained based on Equation 5 from Equation 1 and Equation 3.

$$TDO1\_REAL = TDO1\_IDEAL \times Gr/Gi + \text{offset error} \quad \text{[Equation 5]}$$

In some example embodiments, the gain error may be calculated by obtaining a first difference digital code by subtracting the second test digital code TDO2_REAL from the first test digital code TDO1_REAL, by obtaining a second difference digital code by subtracting the second ideal digital code TDO2_IDEAL from the first ideal digital code TDO1_IDEAL, and by dividing the first difference digital code by the second difference digital code. For example, a gain error GE may represent (Gr/Gi) and correspond to a value obtained based on Equation 6 from Equation 2 and Equation 4.

$$GE = (TDO1\_REAL - TDO2\_REAL)/(TDO1\_IDEAL - TDO2\_IDEAL) \quad \text{[Equation 6]}$$

In some example embodiments, the offset error may be calculated by obtaining a digital code by multiplying the gain error by the first ideal digital code TDO1_IDEAL, and by subtracting the digital code, which is obtained by multiplying the gain error by the first ideal digital code TDO1_IDEAL, from the first test digital code TDO1_REAL. For example, an offset error OE may correspond to a value obtained based on Equation 7 from Equation 5.

$$OE = TDO1\_REAL - (GE \times TDO1\_IDEAL) \quad \text{[Equation 7]}$$

However, example embodiments are not limited thereto. In other example embodiments, the offset error may be calculated by obtaining a digital code by multiplying the gain error by the second ideal digital code TDO2_IDEAL, and by subtracting the digital code, which is obtained by multiplying the gain error by the second ideal digital code TDO2_IDEAL, from the second test digital code TDO2_REAL. For example, an offset error OE may correspond to a value obtained based on Equation 3.

$$OE = TDO2\_REAL - (GE \times TDO2\_IDEAL) \quad \text{[Equation 8]}$$

The test result generator 1500 in FIG. 2 may obtain the gain error GE and the offset error OE by performing the above-described calculations based on the first test digital code TDO1_REAL and the second test digital code TDO2_REAL.

In some example embodiments, the memory 1300 in FIG. 2 may store at least one data associated with the first test analog signal TVIN1, the second test analog signal TVIN2, the first test digital code TDO1_REAL, the second test digital code TDO2_REAL, the gain error GE and the offset error OE.

Although example embodiments are described based on two-point calibration scheme, example embodiments are not limited thereto. For example, the gain error and the offset error may be calculated based on three or more test analog signals and three or more test digital codes. Alternatively, the gain error and the offset error may be calculated based on one test analog signal and one test digital code.

Figure 6:
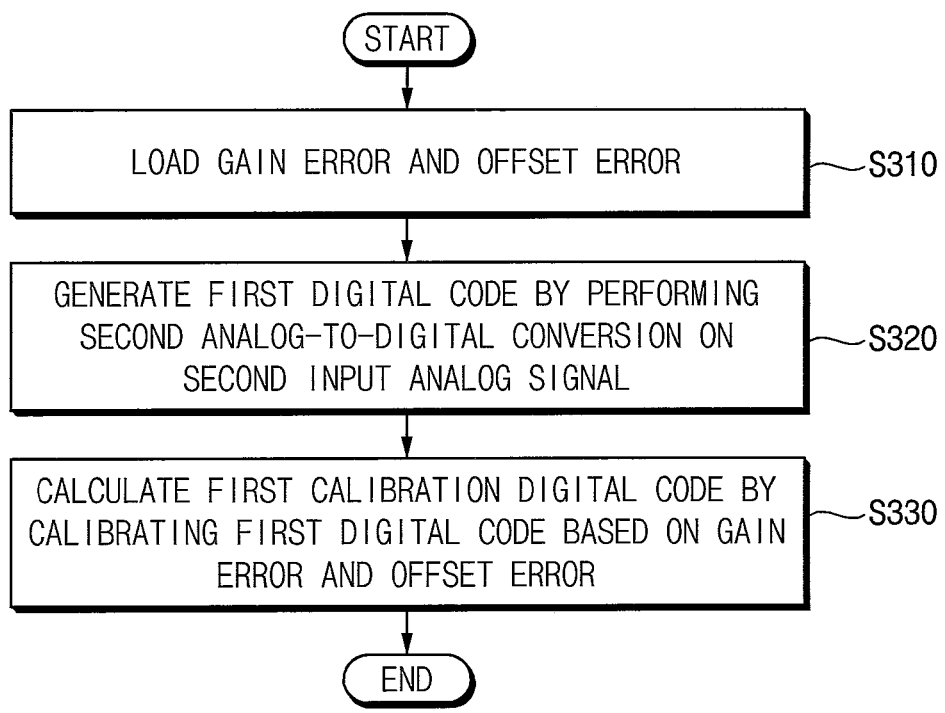
FIG. 6 is a flowchart illustrating an example of generating a calibration digital code in FIG. 1 according to example embodiments.

FIG. 6 is a flowchart illustrating an example of generating a calibration digital code in FIG. 1 according to example embodiments.

Referring to FIGS. 1 and 6, when generating the calibration digital code (step S300), the gain error and the offset error that are stored in the storage may be loaded (step S310).

The analog-to-digital converter may generate a first digital code by performing the second analog-to-digital conversion on a second input analog signal (step S320). In some examples, the second input analog signal may be a test input signal. The analog-to-digital converter may calculate a first calibration digital code by calibrating (or compensating or correcting) the first digital code based on the gain error and the offset error (step S330). A detailed process of calculating the first calibration digital code will be described with reference to FIG. 10.

As described above, steps S310, S320 and S330 may be performed by the analog-to-digital converter while the analog-to-digital converter is driving. In some example embodiments, steps S310, S320 and S330 may be performed by the analog-to-digital converter in a test operation during the manufacturing process of the analog-to-digital converter.

Figure 7:
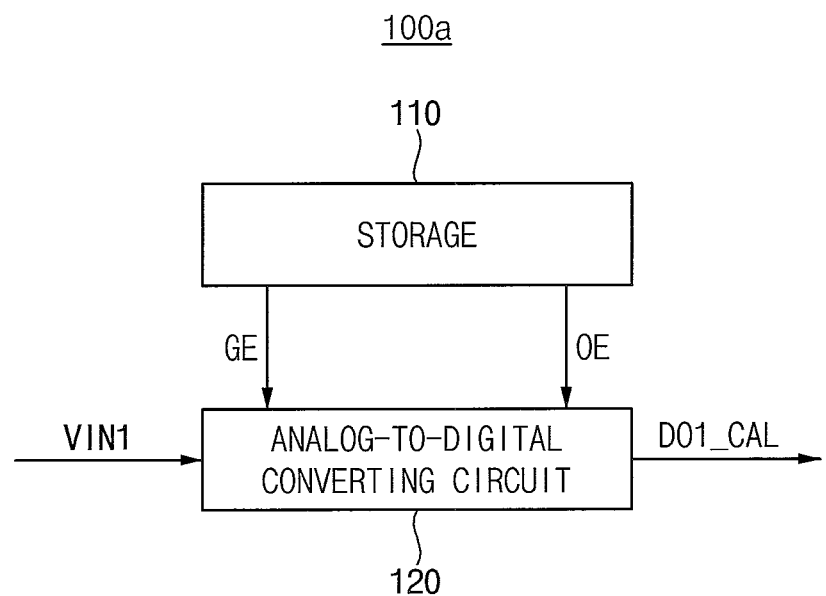
FIG. 7 is a block diagram illustrating an analog-to-digital converter according to example embodiments.

FIG. 7 is a block diagram illustrating an analog-to-digital converter according to example embodiments.

Referring to FIG. 7, an analog-to-digital converter 100a includes a storage 110 and an analog-to-digital converting circuit 120. FIG. 7 illustrates an example where the storage 110 is disposed inside the analog-to-digital converter 100a.

The storage 110 stores the gain error GE and the offset error OE. The gain error GE and the offset error OE may be obtained as described with reference to FIGS. 1 through 5. For example, the gain error GE and the offset error OE may be obtained by performing the test operation on the analog-to-digital converter 100a during the manufacturing process of the analog-to-digital converter 100a, and may be used to calibrate the digital code generated from the analog-to-digital converter 100a.

In some example embodiments, the storage 110 may include a register. For example, each of the gain error GE and the offset error OE may be 32-bit data, and thus the storage 110 may be implemented as a storage space having a relatively small size and simple structure.

The analog-to-digital converting circuit 120 generates and outputs a first calibration digital code DO1_CAL by performing the second analog-to-digital conversion on a first input analog signal VIN1 (or a test analog signal TVIN) based on the gain error GE and the offset error OE. For example, the second analog-to-digital conversion may be performed while the analog-to-digital converter 100a is driving after the manufacturing process of the analog-to-digital converter 100a. In some example embodiments, the second analog-to-digital conversion may be performed in the test operation during the manufacturing process of the analog-to-digital converter 100a. A configuration of the analog-to-digital converting circuit 120 will be described with reference to FIG. 8.

In some example embodiments, at least a part of the analog-to-digital converting circuit 120 may be implemented as hardware. For example, at least a part of the analog-to-digital converting circuit 120 may be included in a computer-based electronic system. In other example embodiments, at least a part of the analog-to-digital converting circuit 120 may be implemented as instruction codes or program routines (e.g., a software program). For example, the instruction codes or the program routines may be executed by a computer-based electronic system, and may be stored in any storage device located inside or outside the computer-based electronic system.

Figure 8:
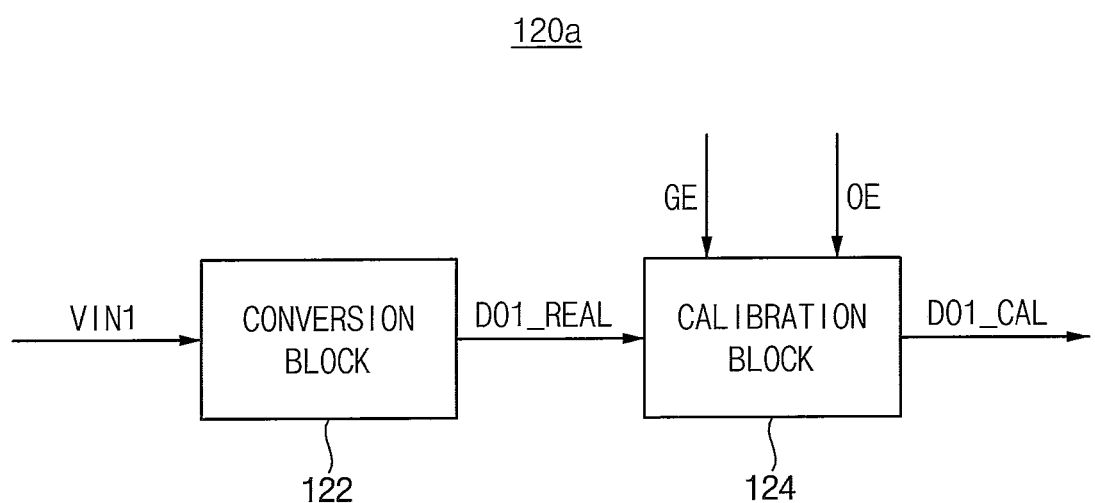
FIG. 8 is a block diagram illustrating an example of an analog-to-digital converting circuit that is included in an analog-to-digital converter according to example embodiments.

FIG. 8 is a block diagram illustrating an example of an analog-to-digital converting circuit that is included in an analog-to-digital converter according to example embodiments.

Referring to FIG. 8, an analog-to-digital converting circuit 120a may include a conversion block 122 and a calibration block 124.

The analog-to-digital converting circuit 120a may generate and output the first calibration digital code DO1_CAL by performing the operation described with reference to FIG. 6.

For example, when the first input analog signal VIN1 (or the first test analog signal TVIN1) is received, the conversion block 122 may generate a first digital code DO1_REAL by performing an analog-to-digital conversion on the first input analog signal VIN1. As will be described with reference to FIG. 10, the first digital code DO1_REAL may be generated depending on the second relationship DO_REAL between the input analog voltage and the output digital code.

When the first input analog signal VIN1 (or the test analog signal TVIN) is received, the calibration block 124 may load the gain error GE and the offset error OE that are stored in the storage 110, and may calculate the first calibration digital code DO1_CAL by calibrating the first digital code DO1_REAL based on the gain error GE and the offset error OE. A detailed process of calculating the first calibration digital code DO1_CAL will be described with reference to FIG. 10.

In some example embodiments, the conversion block 122 may be implemented as hardware, and the calibration block 124 may be implemented as software (e.g., instruction codes or program routines). For example, the calibration operation for the first digital code DO1_REAL based on the gain error GE and the offset error OE according to example embodiments may be implemented based on a software manner. An additional circuit (or hardware) and/or design change for performing the calibration operation may not be required, and the calibration operation may be performed using an existing hardware configuration as it is. Accordingly, an additional design overhead and additional design cost may not be required for implementing example embodiments.

In some example embodiments, the conversion block 122 may be implemented based on at least one of various schemes such as a direct-conversion scheme, a successive approximation scheme, a ramp-comparing scheme, a Wilkinson scheme, an integrating scheme, a delta-encoded scheme, a pipelined scheme, a sigma-delta scheme, a time-interleaved scheme, or the like, and/or may be implemented based on at least one of other various schemes.

Figure 9:
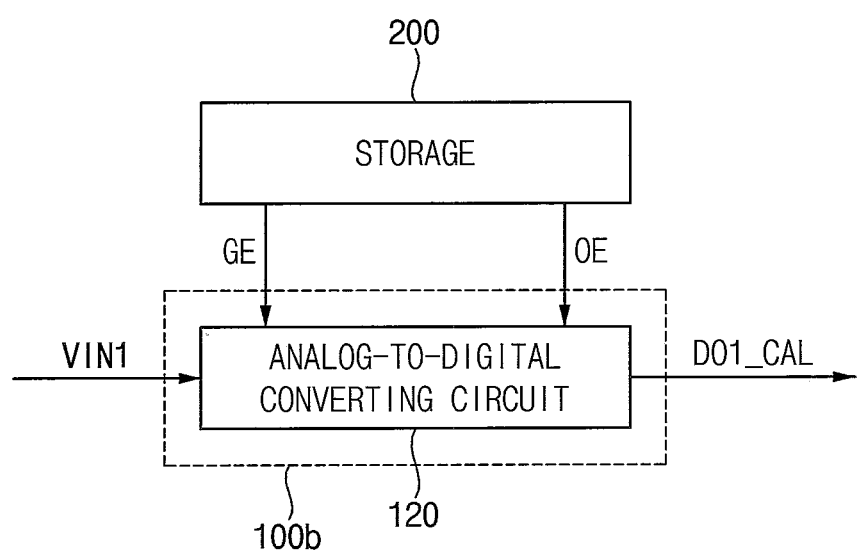
FIG. 9 is a block diagram illustrating an analog-to-digital converter according to example embodiments.

FIG. 9 is a block diagram illustrating an analog-to-digital converter according to example embodiments. The descriptions repeated with FIG. 7 will be omitted.

Referring to FIG. 9, an analog-to-digital converter 100b includes an analog-to-digital converting circuit 120. FIG. 9 illustrates an example where a storage 200 is disposed outside the analog-to-digital converter 100b.

The storage 200 may be substantially the same as the storage 110 in FIG. 7, except that the storage 200 is disposed outside the analog-to-digital converter 100b. The analog-to-digital converting circuit 120 may be substantially the same as the analog-to-digital converting circuit 120 in FIG. 7.

In some example embodiments, as will be described with reference to FIG. 14, the analog-to-digital converter 100b may be included in a system-on-chip or an application processor, and the storage 200 may be disposed inside the system-on-chip or the application processor. For example, an one-time programmable (OTP) register or memory included in the system-on-chip or the application processor may be used as the storage 200.

Figure 10:
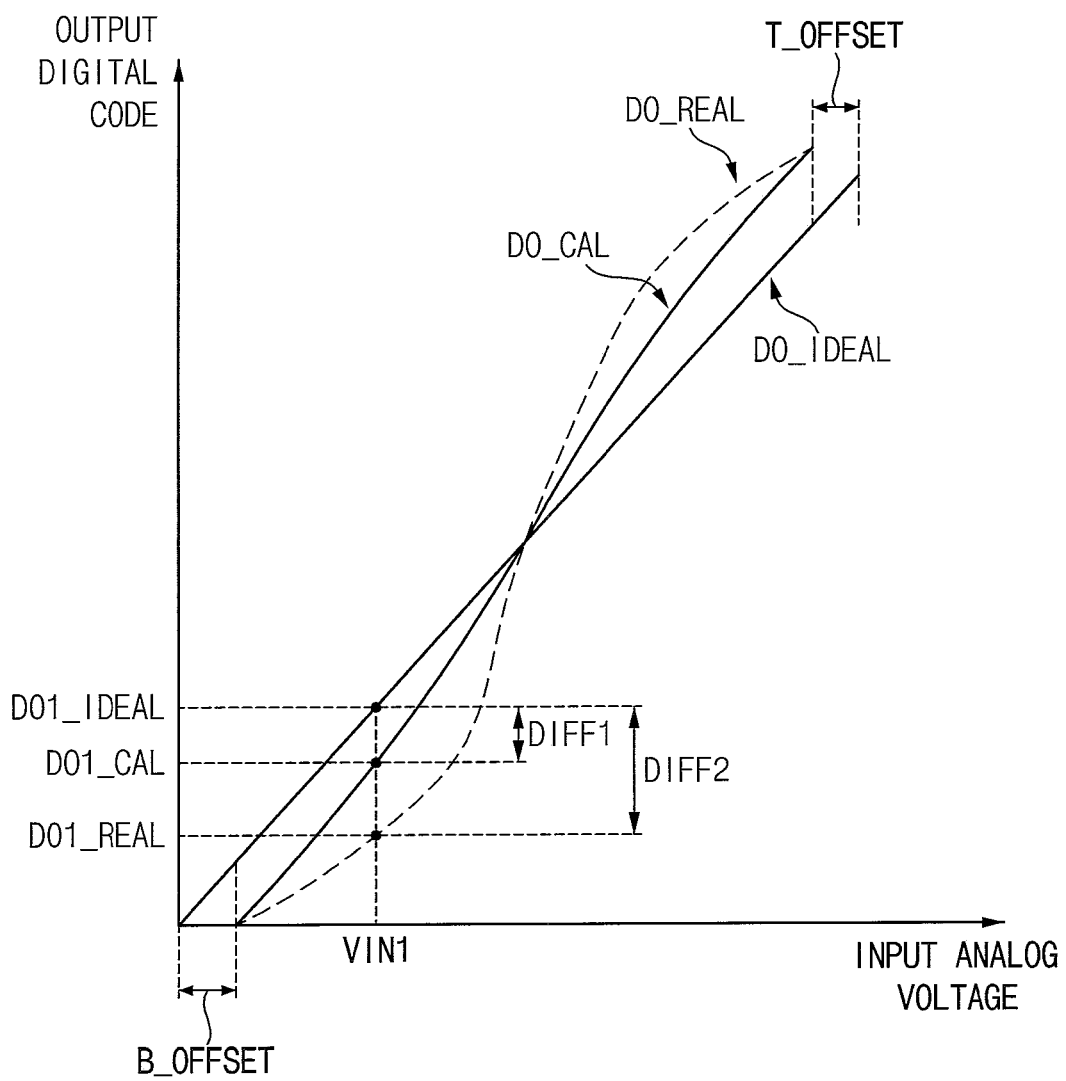
FIGS. 10 and 11 are diagrams for describing an operation of generating a calibration digital code in FIG. 6 and an operation of an analog-to-digital converter according to example embodiments.
Figure 11:
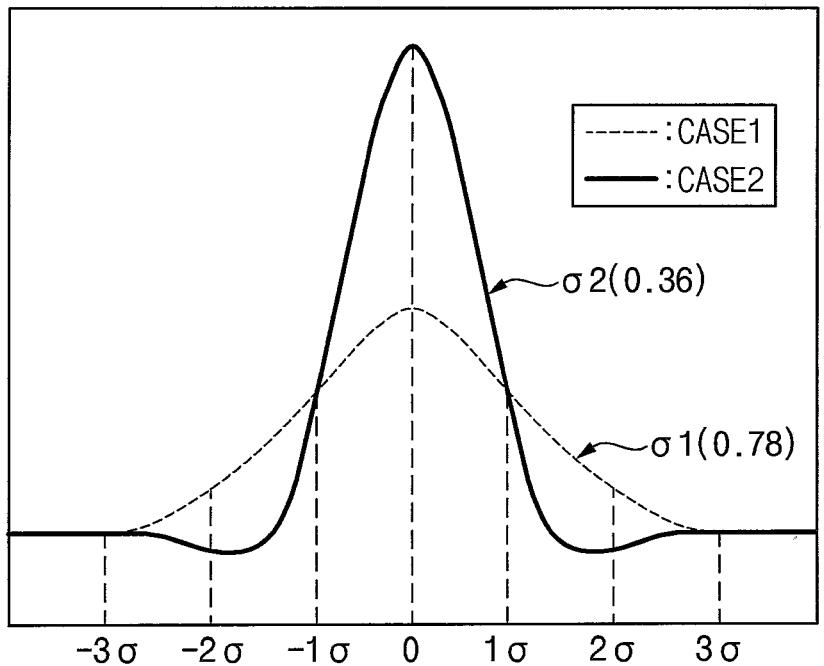

FIGS. 10 and 11 are diagrams for describing an operation of generating a calibration digital code in FIG. 6 and an operation of an analog-to-digital converter according to example embodiments. The descriptions repeated with FIG. 5 will be omitted.

Referring to FIG. 10, a relationship between the input analog voltage input to the analog-to-digital converters 100a and 100b and the digital code and the calibration digital code generated from the analog-to-digital converters 100a and 100b based on the input analog voltage is illustrated. In FIG. 10, "DO_IDEAL" and "DO_REAL" are substantially the same as those described with reference to FIG. 5, and "DO CAL" represents a result of the calibration operation performed based on the gain error GE and the offset error OE, e.g., a third relationship between the input analog voltage and the calibration digital code.

When the first input analog signal VIN1 is input to the analog-to-digital converters 100a and 100b, a first ideal digital code DO1_IDEAL should be generated and output depending on the first relationship DO_IDEAL theoretically, however, the first digital code DO1_REAL may be generated by the conversion block 122 depending on the second relationship DO_REAL. In addition, the calibration operation may be performed on the first digital code DO1_REAL by the calibration block 124 based on the gain error GE and the offset error OE, and thus the first calibration digital code DO1_CAL may be generated and output depending on the third relationship DO CAL finally.

In some example embodiments, the first calibration digital code DO1_CAL may be calculated by obtaining a digital code by subtracting the offset error OE from the first digital code DO1_REAL, and by dividing the digital code, which is obtained by subtracting the offset error OE from the first digital code DO1_REAL, by the gain error GE. For example, the first calibration digital code DO1_CAL may correspond to a value obtained based on Equation 9.

$$DO1\_CAL = (DO1\_REAL - OE)/GE \quad \text{[Equation 9]}$$

In some example embodiments, a first difference DIFF1 between the first ideal digital code DO1_IDEAL and the first calibration digital code DO1_CAL may be smaller than a second difference DIFF2 between the first ideal digital code DO1_IDEAL and the first digital code DO1_REAL. For example, when the range of the input voltage is about 0V to about 1.8V and the output code is the 12-bit code, the second difference DIFF2 may be about 3 codes and the first difference DIFF1 may be about 0.5 codes. Herein, 3 codes may mean a decimal number of 3.0 and 0.5 codes may mean a decimal number of 0.5. For example, 0.5 codes may be an average value obtained from the first differences DIFF1 of the analog-to-digital converters, and 3 codes may be an average value obtained from the second differences DIFF2 of the analog-to-digital converters.

Although not shown in FIG. 10, the offset error may also represent that the output code having a value of "0" is generated until the input voltage increases to a certain voltage level. For example, the output code having a value of "0" may be generated based on the input voltage having a voltage greater than 0V due to the offset error. In this case, the offset error may represent as a difference between two output codes corresponding to the second relationship DO_REAL and a slope obtained from the second relationship DO_REAL at the input voltage having 0V.

When the calibration operation is performed based on the gain error GE and the offset error OE according to example embodiments, the error in the output code (e.g., the error in the first calibration digital code DO1_CAL) may be reduced, and thus the accuracy of the analog-to-digital converters 100a and 100b may be improved or enhanced.

Referring to FIG. 11, a distribution of errors in output codes from a plurality of analog-to-digital converters is illustrated. In FIG. 11, "CASE1" represents an example where example embodiments previously described are not applied, e.g., the first digital code DO1_REAL is output as it is, and "CASE2" represents an example where example embodiments previously described are applied or employed, e.g., the first calibration digital code DO1_CAL is output. For example, a standard deviation ($\sigma 1$) in CASE1 may be about 0.78, and a standard deviation ($\sigma 2$) in CASE2 may be about 0.36. It can be seen that the standard deviation in CASE2 is reduced as compared with that of CASE1, and it can be seen that the performance and accuracy of the analog-to-digital converters 100a and 100b are improved when example embodiments previously described are applied to the analog-to-digital converters 100a and 100b. For example, the standard deviation $\sigma 1$ may be a high standard deviation that indicates low performance and accuracy of analog-to-digital converters and the standard deviation $\sigma 2$ may be a low standard deviation that indicates high performance and accuracy of analog-to-digital converters.

In some example embodiments, only steps S310, S320 and S330 in FIG. 6 may be described as a method of operating an analog-to-digital converter according to example embodiments. For example, example embodiments may include an example that includes only the operation during the actual driving process of step S300 in FIG. 1 as well as an example that includes both the operation during the manufacturing process of steps S100 and S200 in FIG. 1 and the operation during the actual driving process of step S300 in FIG. 1.

Figure 12:
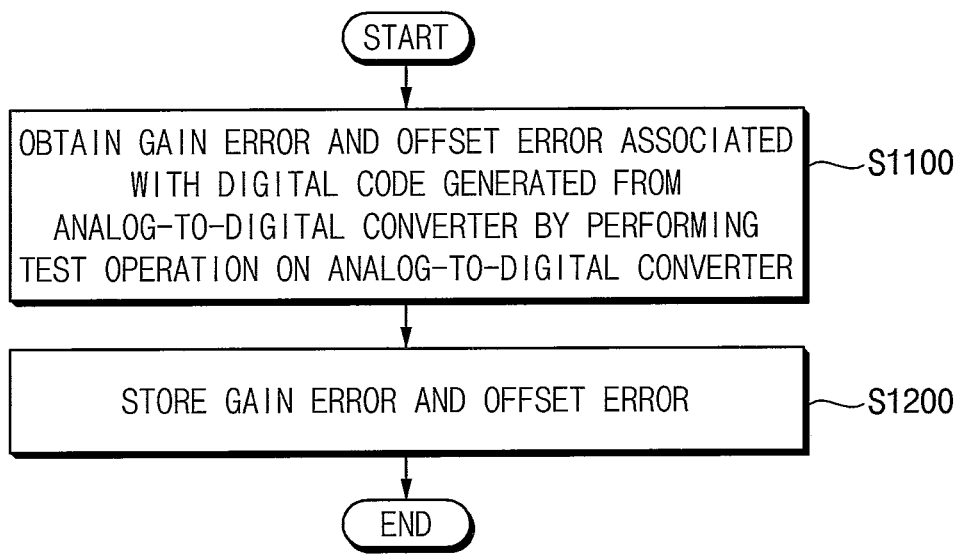
FIG. 12 is a flowchart illustrating a method of manufacturing an analog-to-digital converter according to example embodiments.

FIG. 12 is a flowchart illustrating a method of manufacturing an analog-to-digital converter according to example embodiments. The descriptions repeated with FIG. 1 will be omitted.

Referring to FIG. 12, in a method of manufacturing an analog-to-digital converter according to example embodiments, a gain error and an offset error that are associated with a digital code generated from the analog-to-digital converter are obtained by performing a test operation on the analog-to-digital converter (step S1100). The gain error and the offset error that are obtained by step S1100 are stored (step S1200). Steps S1100 and S1200 may be substantially the same as steps S100 and S200 in FIG. 1, respectively.

Although not illustrated in detail, before step S1100, a plurality of analog-to-digital converters may be fabricated in a mass production.

As will be appreciated by those skilled in the art, the inventive concept may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 13:
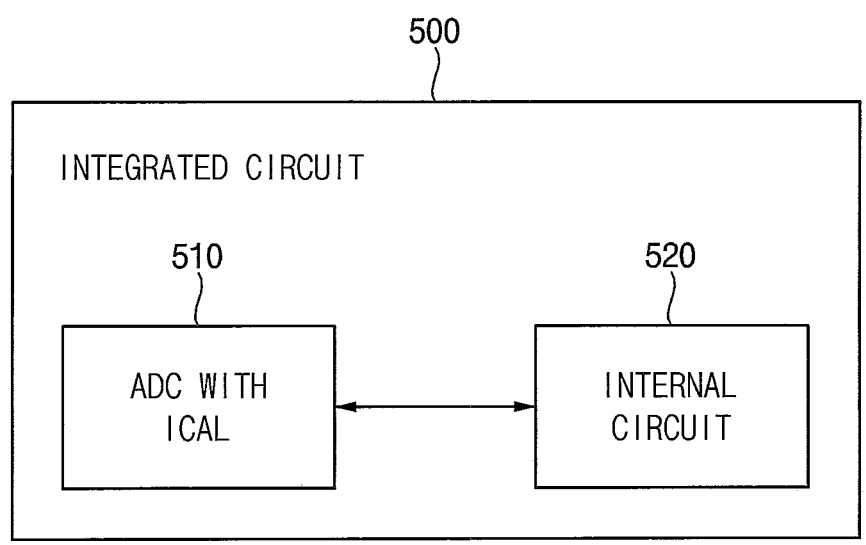
FIG. 13 is a block diagram illustrating an integrated circuit that includes an analog-to-digital converter according to example embodiments.

FIG. 13 is a block diagram illustrating an integrated circuit that includes an analog-to-digital converter according to example embodiments.

Referring to FIG. 13, an integrated circuit 500 may include an analog-to-digital converter 510 and an internal circuit 520.

The analog-to-digital converter 510 may be the analog-to-digital converter according to example embodiments. The analog-to-digital converter 510 may generate the calibration digital code with reduced error by performing an internal calibration ICAL based on the gain error and the offset error that are obtained by performing the test operation during the manufacturing process. The internal circuit 520 may provide an analog input to the analog-to-digital converter 510, may operate based on the calibration digital code output from the analog-to-digital converter 510, or may perform other specific operations.

Figure 14:
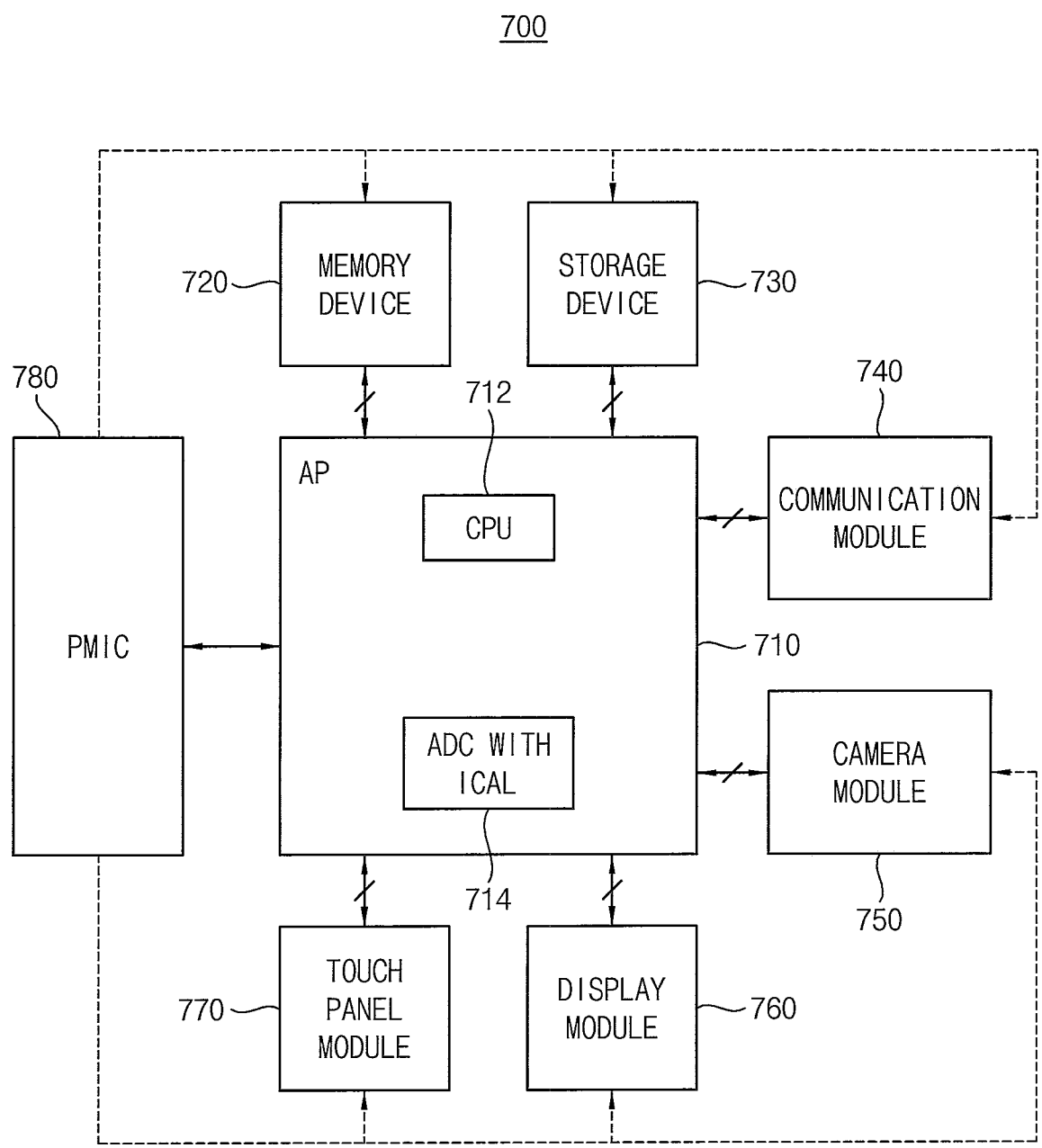
FIG. 14 is a block diagram illustrating an electronic system that includes an analog-to-digital converter according to example embodiments.

FIG. 14 is a block diagram illustrating an electronic system that includes an analog-to-digital converter according to example embodiments.

Referring to FIG. 14, an electronic system 700 may include a system-on-chip 710 and a plurality of functional modules 740, 750, 760 and 770. The electronic system 700 may further include a memory device 720, a storage device 730 and a power management integrated circuit (PMIC) 780.

In some example embodiments, the electronic system 700 may be any mobile system and/or any portable device. For example, the electronic system 700 may be and/or include at least one of a mobile phone, a smart phone, a tablet computer, a laptop computer, a personal digital assistants (PDA), a portable multimedia player (P1V11$^3$), a digital camera, a portable game console, a music player, a camcorder, a video player, a navigation system, etc. The electronic system 700 may further be and/or include a wearable device, an internet of things (IoT) device, an internet of everything (IoE) device, an e-book reader, a virtual reality (VR) device, an augmented reality (AR) device, a robotic device, a drone, an automotive, etc.

The system-on-chip 710 may control overall operations of the electronic system 700. For example, the system-on-chip 710 may control the memory device 720, the storage device 730 and the plurality of functional modules 740, 750, 760 and 770. For example, the system-on-chip 710 may be an application processor that is included in the electronic system 700.

The system-on-chip 710 may include a central processing unit 712 and an analog-to-digital converter 714.

The central processing unit 712 may control overall operations of the system-on-chip 710. For example, the central processing unit 712 may perform various computational functions such as particular calculations and tasks, may execute an operating system (OS) to drive the electronic system 700, and may execute various applications for providing an internet browser, a game, a video, a camera, or the like.

The analog-to-digital converter 714 may be one of the analog-to-digital converters 100, 100a, 100b, and 510 of FIGS. 4A, 4B, 7, 9, and 13, respectively. The analog-to-digital converter 714 may generate the calibration digital code with reduced error by performing an internal calibration ICAL based on the gain error and the offset error that are obtained by performing the test operation during the manufacturing process.

The memory device 720 and the storage device 730 may store data and/or instructions that are processed and/or executed by the electronic system 700. For example, the memory device 720 and the storage device 730 may store a boot image for booting the electronic system 700, a file system for the operating system to drive the electronic system 700, a device driver for an external device connected to the electronic system 700, and/or an application executed on the electronic system 700.

The plurality of functional modules 740, 750, 760 and 770 may perform various functions of the electronic system 700. For example, the electronic system 700 may include a communication module 740 that performs a communication function (e.g., a code division multiple access (CDMA) module, a long term evolution (LTE) module, a radio frequency (RF) module, an ultra wideband (UWB) module, a wireless local area network (WLAN) module, a worldwide interoperability for a microwave access (WIMAX) module, etc.), a camera module 750 that performs a camera function, a display module 760 that performs a display function, a touch panel module 770 that performs a touch sensing function, etc. In some example embodiments, the electronic system 700 may further include a global positioning system (GPS) module, a microphone (MIC) module, a speaker module, a gyroscope module, etc. However, the plurality of functional modules 740, 750, 760 and 770 in the mobile device 700 are not limited thereto.

The power management integrated circuit 780 may provide an operating voltage to the system-on-chip 710, the memory device 720, the storage device 730 and the plurality of functional modules 740, 750, 760 and 770.

The inventive concept may be applied to various electronic devices and systems that include the analog-to-digital converters and the system-on-chips. For example, the inventive concept may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating an analog-to-digital converter, the method comprising:
   obtaining a gain error and an offset error that are associated with a digital code generated from the analog-to-digital converter by performing a first analog-to-digital conversion on a first input analog signal;
   storing the gain error and the offset error; and generating a calibration digital code by performing a second analog-to-digital conversion on a second input analog signal based on the gain error and the offset error, wherein the obtaining of the gain error and the offset error includes:

generating, by the analog-to-digital converter, a first test digital code by performing the first analog-to-digital conversion on a first test voltage of the first input analog signal;

generating, by the analog-to-digital converter, a second test digital code by performing the first analog-to-digital conversion on a second test voltage of the first input analog signal different from the first test voltage of the first input analog signal, calculating the gain error based on the first test digital code and the second test digital code, and calculating the offset error based on the gain error and one of the first test digital code and the second test digital code.

2. The method of claim 1, wherein the gain error is calculated by:

obtaining a first difference digital code by subtracting the second test digital code from the first test digital code, obtaining a second difference digital code by subtracting a second ideal digital code corresponding to the second test voltage of the first input analog signal from a first ideal digital code corresponding to the first test voltage of the first input analog signal, and dividing the first difference digital code by the second difference digital code.

3. The method of claim 2, wherein the offset error is calculated by:

obtaining a first digital code by multiplying the gain error by the first ideal digital code, and subtracting the first digital code from the first test digital code.

4. The method of claim 3, wherein:

the first test voltage of the first input analog signal has a first voltage level, and the second test voltage of the first input analog signal has a second voltage level higher than the first voltage level.

5. The method of claim 4, wherein:

the first voltage level is obtained by multiplying a voltage level of a power supply voltage by X, where X is a real number greater than zero and less than one, and the second voltage level is obtained by multiplying the voltage level of the power supply voltage by Y, where Y is a real number greater than X and less than one.

6. The method of claim 1, wherein operations of the calculating of the gain error and the calculating of the offset error are performed by a test equipment.

7. The method of claim 6, wherein the obtaining of the gain error and the offset error includes generating the first test voltage of the first input analog signal and the second test voltage of the first input analog signal by a test signal generator of the test equipment, and wherein the operations of the calculating of the gain error and the calculating of the offset error are performed by a test result generator of the test equipment.

8. The method of claim 7, further comprising:

controlling operations of the test signal generator and the test result generator by a test controller of the test equipment; and storing at least one data associated with the first test voltage of the first input analog signal, the second test voltage of the first input analog signal, the first test digital code, and the second test digital code.

9. The method of claim 1, wherein the generating of the calibration digital code includes:

loading the gain error and the offset error that are stored;

generating, by the analog-to-digital converter, a first digital code by performing the second analog-to-digital conversion on the second input analog signal; and calculating, by the analog-to-digital converter, a first calibration digital code by calibrating the first digital code based on the gain error and the offset error.

10. The method of claim 9, wherein the first calibration digital code is calculated by:

obtaining a second digital code by subtracting the offset error from the first digital code, and dividing the second digital code by the gain error.

11. The method of claim 10, wherein a first difference between a first ideal digital code corresponding to the second input analog signal and the first calibration digital code is smaller than a second difference between the first ideal digital code and the first digital code.

12. The method of claim 1, wherein the obtaining of the gain error and the offset error is performed in a test operation of the analog-to-digital converter.

13. The method of claim 12, wherein the storing of the gain error and the offset error is performed by a storage after the test operation of the analog-to-digital converter is completed.

14. The method of claim 13, wherein the storage is disposed inside the analog-to-digital converter.

15. The method of claim 13, wherein:

the analog-to-digital converter is included in a system-on-chip (SOC), and the storage is disposed inside the system-on-chip.

16. An analog-to-digital converter comprising:

a storage configured to store a gain error and an offset error that are associated with a digital code generated from the analog-to-digital converter, the gain error and the offset error being obtained by performing a first analog-to-digital conversion on a first input analog signal; and an analog-to-digital converting circuit configured to generate a calibration digital code by performing a second analog-to-digital conversion on a second input analog signal based on the gain error and the offset error, wherein the analog-to-digital converter is configured to:

generate a first test digital code by performing the first analog-to-digital conversion on a first test voltage of the first input analog signal, and generate a second test digital code by performing the first analog-to-digital conversion on a second test voltage of the first input analog signal different from the first test voltage of the first input analog signal, wherein the gain error is obtained based on the first test digital code and the second test digital code, and wherein the offset error is obtained based on the gain error and one of the first test digital code and the second test digital code.

17. The analog-to-digital converter of claim 16, wherein the analog-to-digital converting circuit is configured to:

load the gain error and the offset error from the storage, receive the second input analog signal to which the second analog-to-digital conversion is to be performed, generate a first digital code by performing the second analog-to-digital conversion on the second input analog signal, and calculate a first calibration digital code by calibrating the first digital code based on the gain error and the offset error.

18. The analog-to-digital converter of claim 17, wherein the analog-to-digital converting circuit includes a calibration block configured to calculate the first calibration digital code by calibrating the first digital code based on a software manner.

19. A method of operating an analog-to-digital converter, the method comprising:
- generating, by the analog-to-digital converter, a first test digital code by performing a first analog-to-digital conversion on a first test analog signal;
- generating, by the analog-to-digital converter, a second test digital code by performing the first analog-to-digital conversion on a second test analog signal different from the first test analog signal;
- calculating, by a test equipment, a gain error associated with a digital code generated from the analog-to-digital converter based on the first test digital code and the second test digital code;
- calculating, by the test equipment, an offset error associated with the digital code generated from the analog-to-digital converter based on the gain error and one of the first test digital code and the second test digital code;
- storing the gain error and the offset error into a storage disposed inside or outside the analog-to-digital converter;
- loading, by the analog-to-digital converter, the gain error and the offset error from the storage;
- generating, by the analog-to-digital converter, a first digital code by performing a second analog-to-digital conversion on a first input analog signal; and
- generating, by the analog-to-digital converter, a first calibration digital code by calibrating the first digital code based on the gain error and the offset error, wherein the gain error is calculated by:
- obtaining a first difference digital code by subtracting the second test digital code from the first test digital code,
- obtaining a second difference digital code by subtracting a second ideal digital code corresponding to the second test analog signal from a first ideal digital code corresponding to the first test analog signal, and
- dividing the first difference digital code by the second difference digital code, and wherein the offset error is calculated by:
- obtaining a second digital code by multiplying the gain error by the first ideal digital code, and
- subtracting the second digital code from the first test digital code.

* * * * *